United States Patent [19]

Arabadji

[11] 4,346,306

[45] Aug. 24, 1982

[54] METHOD AND APPARATUS FOR GENERATING HIGH CURRENT IMPULSES

[75] Inventor: Petre Arabadji, Bucharest, Romania

[73] Assignee: Institutul de Cercetari Pentru Industria Electrotehnica, Bucharest, Romania

[21] Appl. No.: 72,467

[22] Filed: Sep. 4, 1979

[30] Foreign Application Priority Data

Sep. 1, 1978 [RO] Romania .................................. 95085

[51] Int. Cl.³ .............................................. H03K 3/00
[52] U.S. Cl. .................................................... 307/108
[58] Field of Search ................ 307/106, 108; 324/111; 328/59, 65, 67

[56] References Cited

U.S. PATENT DOCUMENTS 2,508,103  5/1950  Dawson ............................ 328/67 X
2,912,601  11/1959  Slatten, Jr. ............................ 328/65

Primary Examiner—William M. Shoop

[57] ABSTRACT

The invention relates to a method and apparatus for generating long-duration current impulses, as well as high-amplitude short-duration impulses, such as the type of pulses used in testing electrical equipment, in generating high magnetic fields, and for studying the properties of materials.

A ladder network using equal capacitors in all its stages and equal inductances in all but the first and last stages forms the current generating apparatus. In order to convert the apparatus from a long current pulse to a short current pulse configuration the inductances are eliminated. In both configurations the internal resistance of the circuit elements constitutes the internal resistance of the apparatus.

6 Claims, 7 Drawing Figures

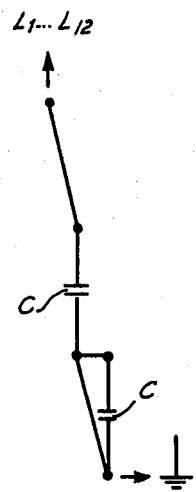
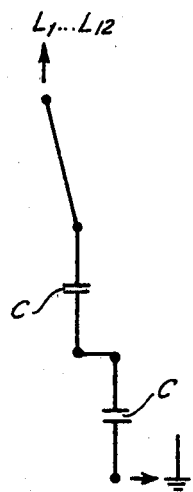
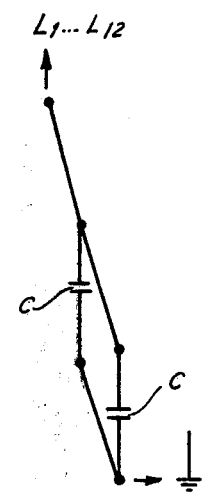
FIG. 2      FIG. 3      FIG. 4
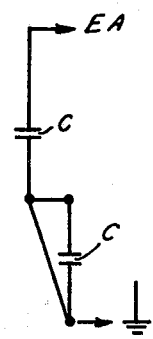
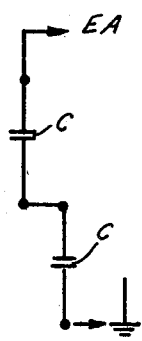
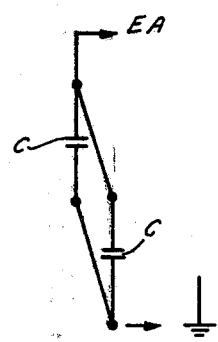
FIG. 5      FIG. 6      FIG. 7

METHOD AND APPARATUS FOR GENERATING HIGH CURRENT IMPULSES

BACKGROUND OF THE INVENTION

The invention refers to a method and apparatus in an optimized system for generating long-duration rectangular current impulses, as well as high amplitude short-duration impulses, in order to test electrical equipment, to obtain high magnetic fields, and to study the material properties.

The prior art methods and equipment using a ladder network synthesis for obtaining long-duration rectangular impulses, and having as a common element solutions derived from the continued fractional development of the impedances or admittances characteristic to these circuits, are well known. Some methods and apparatus for obtaining rectangular impulses which use equal stage capacities and mutual inductances, are also known.

The disadvantage of these methods, and at the same time, of the resulting apparatus is that the values of the elements in the ladder network stages, are unequal. Such solutions are disadvantageous not only from the point of view of their practical achievement, but particularly from the point of view of the functional flexibility, that is, of the possibility to obtain different impulse shapes for a large variety of load characteristics.

There are known devices with equal stage capacities, but being designed for a certain load, they are characterized by an extremely restricted functional flexibility.

Methods and apparatus are also known, for obtaining high amplitude short-duration impulses in the presence of nonlinear loads, as it is the case with the variable resistance arresters, which use comparatively high linear resistances in order to obtain the impulse shape parameters within the necessary tolerances.

The main disadvantages lie on the one hand in their ineffeciency, and on the other, they refer to the compatibility with rectangular impulses generating equipment. Thus, an important part of the energy stored in the capacitors is uselessly consumed in the linearizing resistance, while the circuit elements, due to the required values, cannot be used for obtaining the rectangular impulses. Therefore, today, independent apparatus is used, for obtaining long-duration rectangular impulses, and high amplitude short-duration impulses, respectively.

SUMMARY OF THE INVENTION

The method according to the invention, eliminates the above-mentioned disadvantages by using a single group of capacitors, both for obtaining long-duration rectangular impulses, and high amplitude short-duration impulses. The method of the invention determines the stage capacity as the common value of the solutions established for variants having as a parameter the number of stages, this number being between the possible lower and upper limits which insure the impulse shape within the tolerance range. The method of the invention uses the number of circuit stages as a parameter for obtaining various impulse shapes when the characteristics of the load differ widely. Such method uses the coil resistances as effective circuit synthesis elements, and uses the maximum reduction of the current impulse generating circuit impedance for energy efficiency. The high current impulse generating equipment based upon this method, in order to generate long-duration rectangular impulses uses a ladder network with equal capacitances on each stage, equal inductances, except the first and the last stages, said inductances obtained by means of a single coil on the stage, and resistances, represented by the internal resistances of the coils; while in order to obtain high amplitude short-duration impulses, the method uses the same capacitors, eliminating the inductances and making use of the resulting circuit internal inductance, in order to generate impulses of a certain shape adapted to the conditions and characteristics of the load, a number of stages and values adequate to the elements being used.

In order to carry out the method of the invention, the number of stages and the values of the circuit elements used for obtaining the long-duration rectangular impulses are determined by computing the ensemble set of the circuit synthesis solutions, $G_{i,j,N}\{C_{i,j,N}, L_{i,j,N}, A_{i,j,N}, B_{i,j,N}\}$ (where $C_{i,j,N}$ represents the stage electrical capacity, $L_{i,j,N}$ represents the stage inductivity except for the first and last stages, while $A_{i,j,N}$ and $B_{i,j,N}$ represent the ratios between, respectively, the first and last stage inductivities and $L_{i,j,N}$) for all the discharge classes which specify the technical conditions for generating, the current impulse forms and amplitude, represented by the index "i", for all load object rates characteristics, represented by the index "j", and for every number of stages which offer solutions, represented by the index "N", computing ensemble set $G_{i,j,N}$ for the same coil diameter and the same diameter of the conductor used for forming the coils which, by determining the stage resistance, contribute to obtaining the impulse waveforms, taking into account the dielectric and thermal stresses, determining the ensemble set $G^*_{i,j} = C^*_{i,j}, L^*_{i,j}, A^*_{i,j}$ which is a sub-ensemble set of solutions, extracted from $G_{i,j,N}$, characterized by the particular stage capacity values $C^*_{i,j} \approx m_{i,j}C$, where C is a capacity value, selected according to the frequency with which it occurs in the ensemble set $G_{i,j,N}$, while m shows the possibility of using the capacitors of a C capacity as a simple stage unit ($m_{i,j}=1$), or two series connected capacitors on each stage ($m_{i,j}=0.5$) or parallel connected on each stage ($m_{i,j}=2$), etc., according to the respective variants; and determining by computation the circuit synthesis solutions ensemble set $G_{i,j}$ for the case $i = 1,2,3, \ldots$, $j = 1,2,3, \ldots$, by introducing the condition $C_{i,j} = m_{i,j}C$, the initial values for computing $G_{i,j}$ being the elements corresponding to $G^*_{i,j}$.

DESCRIPTION OF THE DRAWINGS

In the following, an example of achieving the method and the equipment for obtaining high current impulses according to the invention for testing the variable resistance high voltage arresters, is given, in connection with the drawings, and the table in which:

FIGS. 2, 3, and 4 show details of the capacitor stage connections for long-duration current impulses of FIG. 1;

FIGS. 5, 6, and 7 show details of the capacitor stage connections of FIG. 1 for high amplitude current impulses; and the table is a synoptic table of results achieved by utilizing the apparatus shown in the drawing.

DESCRIPTION OF THE PREFERRED EMBODIMENT

Figure 1:
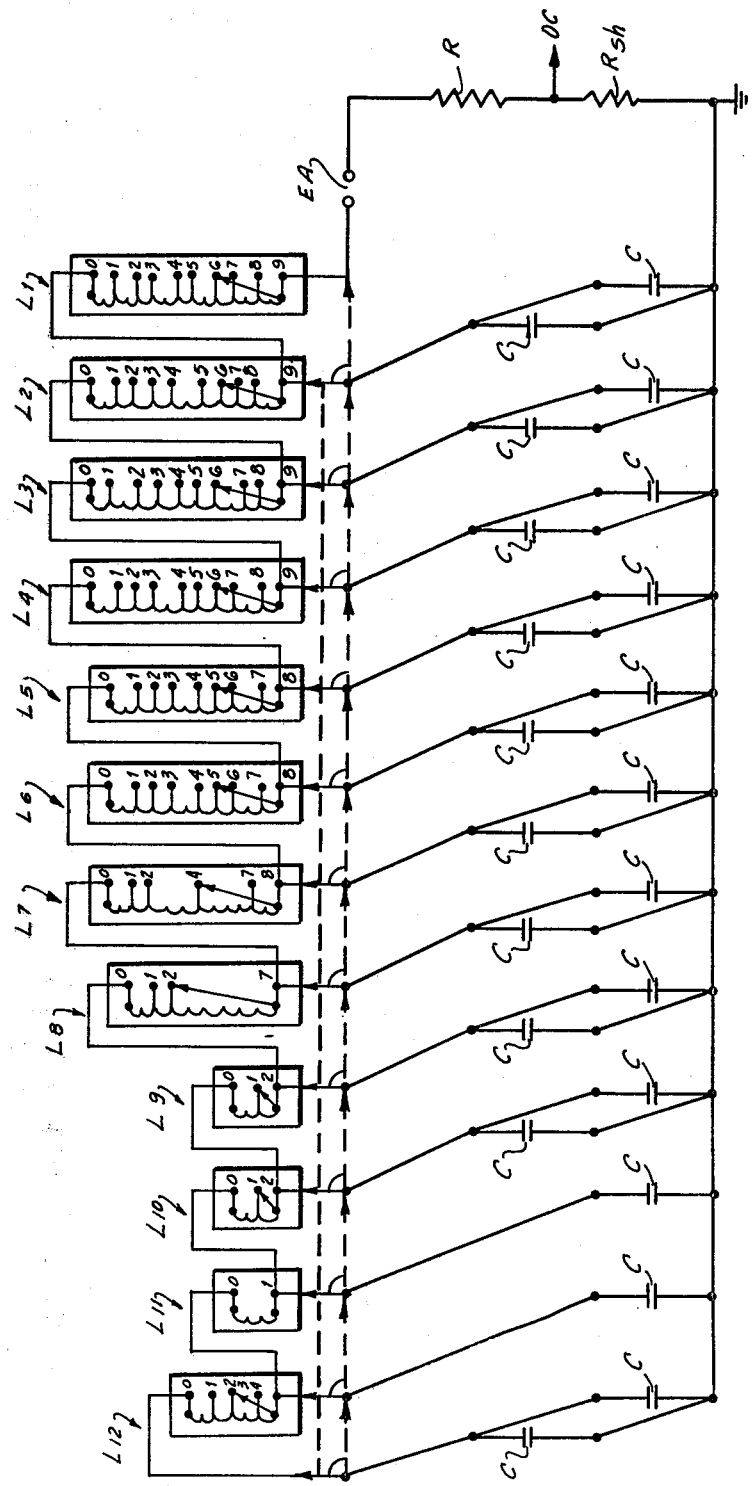
FIG. 1 is a basic circuit diagram of the current impulse apparatus for testing variable resistance arresters.

According to the invention a capacitor bank, having a plurality of stages each stage containing two capacitors C, of C=10 μF, charged to a voltage $U_o$, forms together with the coils $L_1, L_2 \ldots L_{12}$ a ladder network which, after sparking over the spark gap EA, supplies through the load R a long-duration current impulse measured by a shunt $R_{sh}$, according to the testing standards for heavy duty and light duty variable resistance arresters, specified by the International Standards (Publication IEC-99-1); for the above-mentioned example, corresponding to the discharging classes 1, 2, 3 as well as for samples of 6 kV; 7.5 kV; 9 kV; 10.5 kV rated voltages.

The coils offer different inductivity values characteristic of each tap, their optimization leading to the conclusion that not all the coils have to be provided with the same number of taps.

In order to obtain long-duration current impulses the apparatus is used according to the Table. For example, in order to test a sample of 6 kV rated voltage under the testing conditions corresponding to class 1, a load resistance of 1.9.8Ω is used, the connections, forming a ladder network with the first 7 stages, each stage capacity being of 10 μF, and with the coils $L_1 \ldots L_6$ on tap number 6, are made, while the other connections are made on tap number 0. The capacitor battery thus accomplished is loaded at 18 kV, and, by discharging it, a current impulse is obtained, its waveform parameters meeting the tolerances specified by the Standards. The same number of the tap on each coil $L_1 \ldots L_{12}$ represents the same inductivity and resistance, except the end coils $L_1$ and $L_{12}$ which differ in order to include the impulse parameters in the tolerance range.

At the same time, the taps 0 .. 9 of the coils $L_1 \ldots L_{12}$ insure the linear resistances, too, necessary to obtain the impulse shapes by means of their internal resistances.

According to the testing conditions and the characteristics of the tested object a corresponding number of stages and adequate values for the circuit elements are being used.

The equipment is used for obtaining high amplitude short-duration current impulses when testing the arresters in the case of a $r=bi^\alpha$ type nonlinear load, where r is a nonlinear resistance, b=a proportionality constant, i=the current passing through the resistor r, and α=a nonlinearity coefficient which can have values between 0.08 and 1. In these conditions, due to the impulse reduced durations, only the capacitors C, the internal resistance and internal inductance of the obtained circuit are used, not the coils $L_1 \ldots L_{12}$.

By means of such apparatus long-duration impulses are obtained, for example, impulses up to 1040 A, and a virtual duration of the peak up to 3200μ, for heavy-duty arresters and light-duty arresters, and short-duration impulses of a 8/20 shape, with amplitudes up to 40 kA, and of a 4/10 shape, up to 100 kA.

This equipment can also be used to perform the arresters operating duty test.

By using the method and the apparatus according to the invention, the following advantages are obtained:

operating efficiency optimization by reducing the additional dissipative elements to the lowest possible values. Thus, the main energy stored in the capacitors is dissipated in the load;

functional optimization by using the same circuit elements to obtain a great diversity of shapes and amplitudes for the impulses obtained in the case of a great variety of the load characteristics;

constructive optimization due to the equal capacities in all ladder network stages and by using the coils internal resistances as elements which have an active contribution in obtaining the wave shape parameters, thus eliminating the high voltage localized resistances;

functional integration by producing with a single apparatus different types of current impulses which in the prior art, were obtained with several different devices;

economical optimization by reducing the cost of the equipment and the testing operations, as a result of the above-mentioned technical optimization elements.

TABLE

| CL | $U_n$ [kV] | $U_o$ [kV] | R [Ω] | C [μF] | N | $L_1$ | $L_2$ | $L_3$ | $L_4$ | $L_5$ | $L_6$ | $L_7$ | $L_8$ | $L_9$ | $L_{10}$ | $L_{11}$ | $L_{12}$ |
|---|---|---|---|---|---|---|---|---|---|---|---|---|---|---|---|---|---|
| 1 | 6 | 18 | 19,8 | 10 | 7 | 6 | 6 | 6 | 6 | 6 | 6 | 0 | 0 | 0 | 0 | 0 | 0* |
|  | 7,5 | 22,5 | 24,75 | 10 | 5 | 9 | 9 | 9 | 9 | 0 | 0 | 0 | 0 | 0 | 0 | 0 | 0* |
|  | 9 | 27 | 29,7 | 5 | 9 | 7 | 7 | 7 | 7 | 7 | 7 | 7 | 7 | 0 | 0 | 0 | 0* |
|  | 10,5 | 31,5 | 34,65 | 5 | 8 | 8 | 8 | 8 | 8 | 8 | 8 | 8 | 0 | 0 | 0 | 0 | 0* |
| 2 | 6 | 15,6 | 10,8 | 20 | 6 | 3 | 3 | 3 | 3 | 3 | 0 | 0 | 0 | 0 | 0 | 0 | 3 |
|  | 7,5 | 19,5 | 13,5 | 20 | 5 | 5 | 5 | 5 | 5 | 0 | 0 | 0 | 0 | 0 | 0 | 0 | 4 |
|  | 9 | 23,4 | 16,2 | 10 | 8 | 4 | 4 | 4 | 4 | 4 | 4 | 4 | 0 | 0 | 0 | 0 | 0* |
|  | 10,5 | 27,3 | 18,9 | 10 | 7 | 5 | 5 | 5 | 5 | 5 | 0 | 0 | 0 | 0 | 0 | 0 | 0* |
| 3 | 6 | 15,6 | 7,2 | 20 | 11 | 1 | 1 | 1 | 1 | 1 | 1 | 1 | 1 | 1 | 1 | 0* | 1 |
|  | 7,5 | 19,5 | 9 | 20 | 9 | 2 | 2 | 2 | 2 | 2 | 2 | 2 | 2 | 0 | 0 | 0 | 2 |
|  | 9 | 23,4 | 10,8 | 20 | 7 | 3 | 3 | 3 | 3 | 3 | 3 | 0 | 0 | 0 | 0 | 0 | 3 |
|  | 10,5 | 27,3 | 12,6 | 10 | 12 | 2 | 2 | 2 | 2 | 2 | 2 | 2 | 2 | 2 | 2 | 2 | 0* |

What is claimed is:

1. A method of generating high current impulses comprising the steps of charging a plurality of parallel connected pairs of capacitors both for generating long-duration rectangular current impulses, and high amplitude short-duration impulses, determining the stage capacity as a common value of the solutions established for variants having as a parameter the number of stages, the latter being between the possible lower and upper limits which insure the impulse shape within a tolerance range, varying the number of circuit stages to obtain various impulse shapes when the load characteristics differ widely, using the coil internal resistances as an effective circuit synthesis element, and eliminating the coils and using the internal impedance and internal inductance of the circuit during the generation of high amplitude short-duration current impulses thereby optimizing the energy efficiency and achieving compatibility in long-duration and short-duration rectangular impulse generator.

2. Method of generating high current impulses according to claim 1, wherein the number of stages and the values of the circuit elements used for obtaining the long-duration rectangular impulses are determined according to the following procedure:

determining by computation the ensemble set of the circuit synthesis solutions, $G_{i,j,N}\{C_{i,j,N}, L_{i,j,N}, A_{i,j,N}, B_{i,j,N}\}$ (where $C_{i,j,N}$ represents the stage electrical capacity, $L_{i,j,N}$ represents the stage inductivity except the first and the last stage, while $A_{i,j,N}$ and $B_{i,j,N}$ represent the ratio between the first and the last stage inductivity, respectively, and $L_{i,j,N}$) for all the discharging clases which specify the technical conditions for generating, the current impulse forms and amplitude, represented by the index "i", for all load object rates characteristics, represented by the index "j", and for every number of stages which offers solutions, represented by index "N", computing ensemble set $G_{i,j,N}$ for the same coil diameter and the same diameter of the conductor used for forming the coils which, by determining the stage resistance, contribute to obtaining the impulse wave-forms, taking into account the dielectric and thermal stresses, determining the ensemble set $G^*_{i,j} = C^*_{i,j}, L^*_{i,j}, A^*_{i,j}, A^*_{i,j} B^*_{i,j}$ which is a subensemble set of solutions, extracted from $G_{i,j,N}$, characterized by the particular stage capacity values $C^*_{i,j} \approx m_{i,j} C$, where C is a capacity value, selected according to the frequency with which it occurs in the ensemble set $G_{i,j,N}$, while m shows the possibility of using the capacitors of a C capacity as a simple stage unit (m=1), or two series connected capacitors on each stage ($m_{i,j}=0.5$) or parallel connected on each stage ($m_{i,j}=2$), etc., according to the respective variant, and determining by computation the circuit synthesis solutions ensemble set $G_{i,j}$ for the cases i=1,2,3 ... , j=1,2,3 ... , by introducing the condition $C_{i,j} = m_{i,j} C$, the initial values for computing $G_{i,j}$ being the elements corresponding to $G^*_{i,j}$.

3. Method of generating high current impulses according to claim 1, wherein the capacitor rated values (capacity and rated voltage necessary for obtaining the high amplitude short-duration current impulses compatible with those of the capacitors necessary for obtaining the long-duration rectangular current impulses by the following procedure) are determined by computing the inferior and superior capacity limits, between which there are solutions for a given characteristic of the load object, as well as for a specified wave-form and amplitude of the current impulse, taking into consideration only the self-resistance and the self-inductance of the circuit, under these conditions the capacity inferior limit being determined by the loading voltage which can be used, while the superior limit is determined by the circuit inductivity, and from the available values of the capacities existent in the capacitor bank, determined by the method according to claim 2 for generating long-duration rectangular impulses, a capacity value between the inferior and the superior limit previously calculated is extracted, after which, the inductivity, the resistance and the loading voltage necessary for the current impulse form and amplitude for the given load object, are determined, corresponding to the above-mentioned value.

4. Apparatus for generating high current impulses comprising a ladder network having a plurality of equal capacitors on each stage, equal valued series connected coil inductances connected across the capacitors, the first and the last stages having inductances with different values than said equal valued inductances and comprising a single coil across each of these stages, the apparatus resistance comprising the internal resistances of the inductances and coils, and means for effectively removing the coil inductances and coils from the network to obtain high amplitude short-duration impulses, the same capacitors being used therefor, the resulting internal circuit resistance and internal circuit inductance being used to generate impulses having a shape adapted to the conditions and the characteristics of the load.

5. Apparatus for generating high current impulses with selectable pulse durations comprising a plurality of substantially identical capacitors arranged in a ladder network, a plurality of serially connected coils connected across said capacitors in said ladder network, the resistance in said ladder network being primarily constituted by the internal resistance of said coils, and means for selectively eliminating the coils from said ladder network to convert the network to an auxiliary operating mode wherein the apparatus generates high current-short pulse duration, the induction of the apparatus in said auxiliary mode being primarily constituted by the internal inductance of the elements of said ladder network.

6. High current impulse generating apparatus yielding long-duration rectangular impulses, comprising a ladder network having equal capacities in each stage, each stage having equal inductances except the first and the last stages, a single coil in each stage, each stage having a resistance represented by the coil self-resistance, switching means for obtaining high amplitude short-duration impulses by using the same capacitor battery, the inductances, and making use of the resulting circuit self-resistance and self-inductance in view of generating impulses having a certain shape adapted to the conditions and the characteristics of the load, the number of stages and their values being adequate for the elements being used.

* * * * *